US006483148B2

(12) United States Patent
Chan et al.

(10) Patent No.: US 6,483,148 B2
(45) Date of Patent: Nov. 19, 2002

(54) SELF-ALIGNED ELEVATED TRANSISTOR

(75) Inventors: Lap Chan, San Francisco, CA (US); Cher Liang Cha, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/060,818

(22) Filed: Feb. 1, 2002

(65) Prior Publication Data

US 2002/0090787 A1 Jul. 11, 2002

Related U.S. Application Data

(62) Division of application No. 09/442,496, filed on Nov. 18, 1999, now Pat. No. 6,326,272.

(51) Int. Cl.⁷ ............................................. H01L 27/01
(52) U.S. Cl. ..................... 257/347; 257/350; 257/67; 257/74; 257/278; 257/288; 257/330
(58) Field of Search ................................. 257/347, 350, 257/351, 66, 67, 69, 74, 262, 278, 288, 330, 331, 344, 365

(56) References Cited

U.S. PATENT DOCUMENTS

| | | | |
|---|---|---|---|
| 4,749,441 A | * 6/1988 | Christenson et al. | 117/97 |
| 5,453,396 A | 9/1995 | Gonzalez et al. | 437/69 |
| 5,681,776 A | 10/1997 | Hebert et al. | 437/72 |
| 5,686,343 A | 11/1997 | Lee | 437/62 |
| 5,780,343 A | 7/1998 | Bashir | 438/269 |

* cited by examiner

Primary Examiner—Tuan H. Nguyen
Assistant Examiner—Jack Chen
(74) Attorney, Agent, or Firm—George O. Saile; Rosemary L. S. Pike

(57) ABSTRACT

A method of forming a self-aligned elevated transistor using selective epitaxial growth is described. An oxide layer is provided overlying a semiconductor substrate. The oxide layer is etched through to the semiconductor substrate to form a trench having a lower portion contacting the substrate and an upper portion having a width larger than the width of the lower portion. A silicon layer is grown within the trench using selective epitaxial growth wherein the silicon layer fills the lower portion and partially fills the upper portion. Nitride spacers are formed on the sidewalls of the trench. A polysilicon layer is deposited overlying the oxide layer and within the trench and etched back to form a gate electrode within the trench between the nitride spacers. The nitride spacers are etched away where they are not covered by the gate electrode leaving thin nitride spacers on sidewalls of the gate electrode. Ions are implanted into the silicon layer exposed at the edges of the trench whereby source and drain pockets are formed within the silicon layer wherein the junction depth is determined by the thickness of the silicon layer. A dielectric layer is deposited overlying the oxide layer and the gate electrode and source/drain pockets within the trench to complete formation of the self-aligned elevated transistor in the fabrication of an integrated circuit.

20 Claims, 5 Drawing Sheets

SELF-ALIGNED ELEVATED TRANSISTOR

This is a division of patent application Ser. No. 09/442,496, filing date Nov. 18, 1999, now U.S. Pat. No. 6,326,272, Self-Aligned Elevated Transistor, assigned to the same assignee as the present invention.

BACKGROUND OF THE INVENTION (1) Field of the Invention

The invention relates to the fabrication of integrated circuit devices, and more particularly, to a method of forming a self-aligned elevated transistor using the technique of silicon epitaxial growth in the manufacture of integrated circuits.

(2) Description of the Prior Art

Shallow trench isolation (STI) will be employed widely in current and future integrated circuit technologies to provide sufficient isolation between neighboring devices. However, there are a number of problematic issues in STI processes including "hump effects" and chemical mechanical polishing (CMP) induced dishing over wide trenches that must be resolved prior to its further and wider applications. The STI corner represents an abrupt transition from the transistor active area to isolation. The gate polysilicon wraparound of a sharp trench corner causes a separate conduction characteristic of the corner resulting in a "double hump" in the transistor drain current-gate voltage characteristics. It is desired to void the problem of the "hump effects." Another problem with STI processes is that the packing density of integrated circuits will be limited by the dimensions of the isolation trenches. It is desired to fabricate an integrated circuit without the drawbacks of the STI process.

U.S. Pat. No. 4,749,441 to Christenson et al teaches a method of selective epitaxial growth (SEG) to form elevated source/drain regions. However, the gate electrode is not formed by self-aligning techniques. U.S. Pat. No. 5,686,343 to Lee teaches forming an epitaxial layer and patterning it to provide an active area. U.S. Pat. No. 5,780,343 discloses the formation of an SEG layer within a trench and forming a gate thereover. U.S. Pat. No. 5,681,776 to Hebert et al teaches SEG within a trench and then oxidation of the SEG regions to form trench isolation. U.S. Pat. No. 5,453,396 to Gonzalez et al discloses a SEG process for a DRAM.

SUMMARY OF THE INVENTION

A principal object of the present invention is to provide an effective and very manufacturable method of forming a self-aligned elevated transistor in the fabrication of an integrated circuit.

Another object of the present invention is to provide a method of forming a self-aligned elevated transistor using selective epitaxial growth in the fabrication of an integrated circuit.

Yet another object of the present invention is to provide a method of forming a self-aligned elevated transistor wherein there is absolute control over junction depth.

A further object of the invention is to provide a method of forming a self-aligned elevated transistor using selective epitaxial growth wherein there is absolute control over junction depth.

A still further object of the invention is to provide a method of forming a self-aligned elevated transistor wherein the packing density of integrated circuits is not limited by the dimension of isolation trenches.

Yet another object of the present invention is to provide a method of forming a self-aligned elevated transistor without the use of shallow trench isolation.

A still further object of the invention is to provide a method of forming a self-aligned elevated transistor using selective epitaxial growth wherein the packing density of integrated circuits is not limited by the dimension of isolation trenches.

In accordance with the objects of this invention the method of forming a a self-aligned elevated transistor using selective epitaxial growth wherein the packing density of integrated circuits is not limited by the dimension of isolation trenches is achieved. An oxide layer is provided overlying a semiconductor substrate. The oxide layer is etched through to the semiconductor substrate to form a trench having a lower portion contacting the substrate and an upper portion having a width larger than the width of the lower portion. A silicon layer is grown within the trench using selective epitaxial growth wherein the silicon layer fills the lower portion and partially fills the upper portion wherein the thickness of the silicon layer partially filling the upper portion is controlled. A liner oxide layer is deposited overlying the oxide layer and the silicon layer within the trench. Nitride spacers are formed on the sidewalls of the trench over the liner oxide layer. The liner oxide is removed where it is not covered by the nitride spacers overlying the silicon layer. A gate oxide layer is grown overlying the silicon layer within the trench. A polysilicon layer is deposited overlying the oxide layer and within the trench and etched back to form a gate electrode within the trench between the nitride spacers. The nitride spacers are etched away where they are not covered by the gate electrode leaving thin nitride spacers on sidewalls of the gate electrode and exposing the liner oxide overlying the silicon layer at edges of the trench. The exposed liner oxide is etched away. Ions are implanted into the silicon layer at the edges of the trench whereby source and drain pockets are formed within the silicon layer and wherein the controlled thickness of the silicon layer partially filling the upper portion of the trench corresponds to a desired junction depth of the source/drain pockets. The gate electrode and source/drain pockets are silicided. A dielectric layer is deposited overlying the oxide layer and silicided source/drain pockets and silicided gate electrode within the trench wherein the gate electrode and the source/drain pockets form the self-aligned elevated transistor in the fabrication of an integrated circuit.

Also, according to the objects of the invention, a new self-aligned elevated transistor is achieved. An oxide layer overlies a semiconductor substrate. A silicon layer fills a lower portion of a trench through the oxide layer and partially fills an upper portion of the trench wherein the lower portion of the trench contacts the semiconductor substrate and has a width smaller than a width of the upper portion of the trench. A polysilicon gate electrode overlies a center portion of the silicon layer having a gate oxide layer therebetween. Source/drain pockets lie within the silicon layer at edge portions of the silicon layer not covered by the polysilicon gate electrode. A dielectric layer overlies the oxide layer and the gate electrode and source/drain pockets within the trench to complete elevated transistor in an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
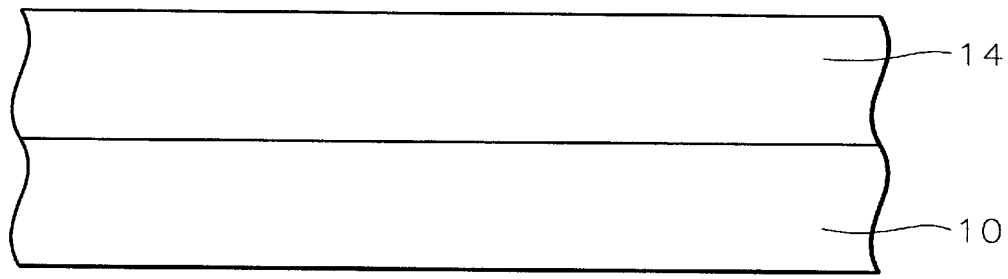
FIGS. 1 through 14 schematically illustrate in cross-sectional representation a preferred embodiment of the present invention.

Referring now to FIG. 1, there is illustrated a portion of a partially completed integrated circuit in which there is a monocrystalline silicon semiconductor substrate 10. An oxide layer 14 is deposited by chemical vapor deposition (CVD) or thermally grown over the surface of the substrate. This layer 14 may comprise undoped silicon oxide and has a thickness of between about 4000 and 6000 Angstroms.

Figure 2:
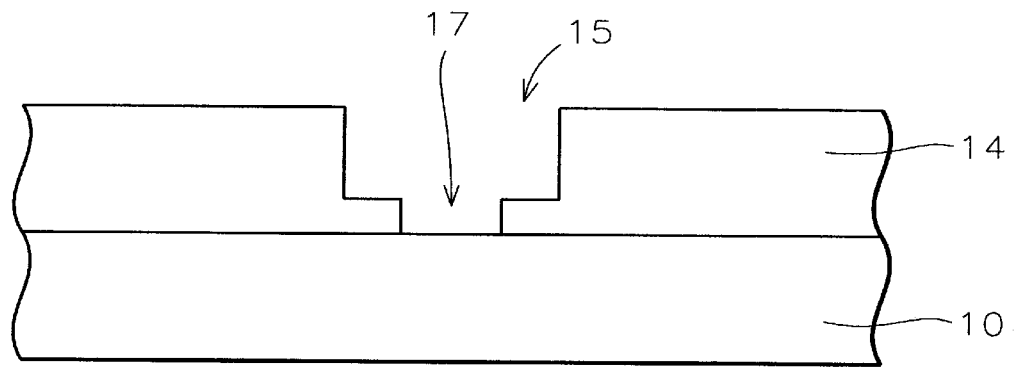

The oxide layer is patterned using conventional photolithographic and etching techniques to form an opening to the substrate as shown in FIG. 2. The opening consists of a wide trench 15 through an upper portion of the oxide layer 14 and a narrow via 17 within the trench continuing through to the substrate surface. For example, the trench 15 has a width of between about 12,500 and 15,000 Angstroms and a depth of between about 3000 and 5000 Angstroms or about ¾ of the thickness of the oxide layer 14. The via 17 has a width of between about 5000 and 10,000 Angstroms and a depth of between about 300 and 500 Angstroms or about ¼ of the thickness of the oxide layer 14. The wide trench 15 can be about 1.0 to 1.25 microns wide or as narrow as about 0.9 microns.

Figure 3:
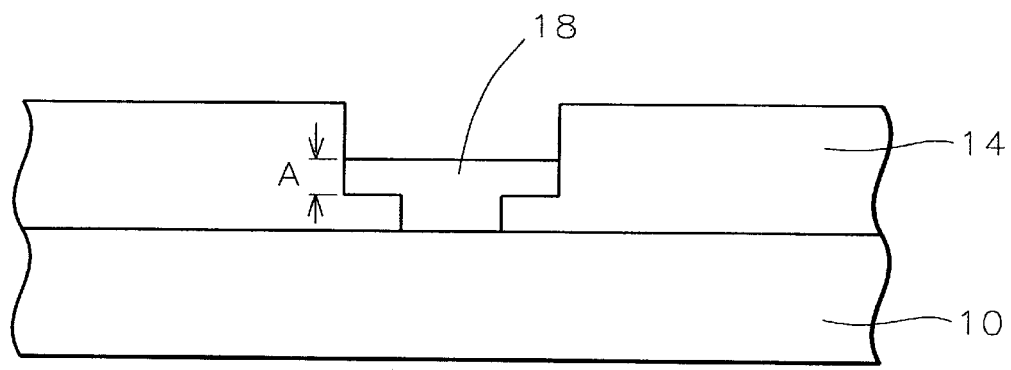

Referring now to FIG. 3, the substrate 10 exposed within the via opening 17 is subjected to selective epitaxial growth (SEG). Silicon 18 grows to fill the via opening and to partially fill the trench opening, as shown. SEG can be controlled to the desired thickness A. The thickness A will be the junction depth of the source/drain regions to be formed subsequently. Typically, the thickness A of the silicon 18 within the trench opening is between about 1000 and 2000 Angstroms.

Selective Epitaxial Growth is described in *ULSI Technology* by C. Y. Chang and S. M. Sze, McGraw-Hill, N.Y., N.Y. c. 1996, pp. 131–132. For example, vapor phase epitaxy or chemical vapor deposition (CVD) epitaxy can be used. At about 1050° C., $SiCl_4$, $SiH_2Cl_2$, $SiHCl_3$, or $SiH_4$ gas may be combined with $H_2$ or HCl gas to result in the formation of a Si solid film 18.

Figure 4:
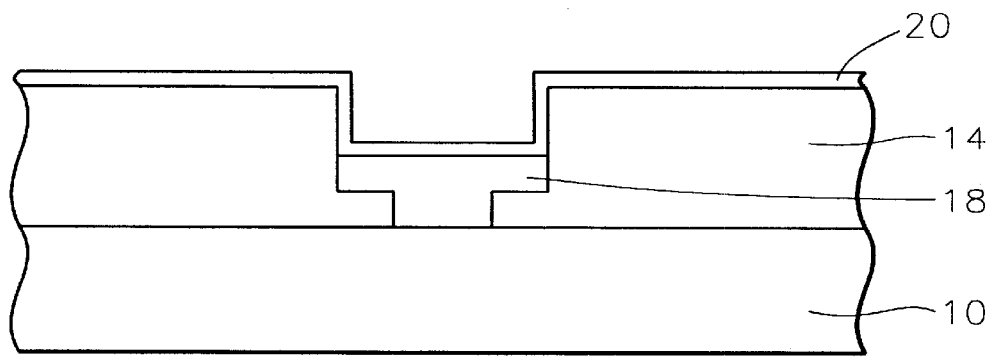

Next, referring to FIG. 4, a liner oxide 20 is deposited by CVD over the surface of the oxide layer 14 and over the surface of the silicon layer 18 within the trench. This liner oxide has a preferred thickness of between about 500 and 1000 Angstroms.

Figure 5:
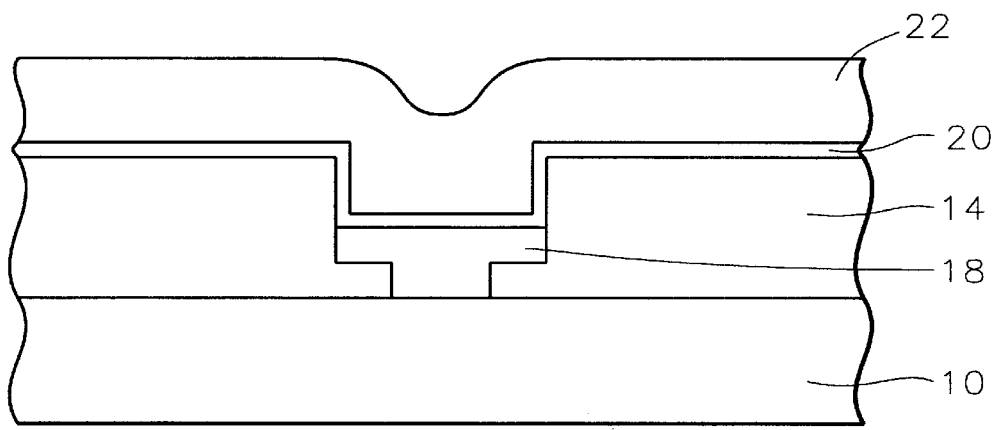
Figure 6:
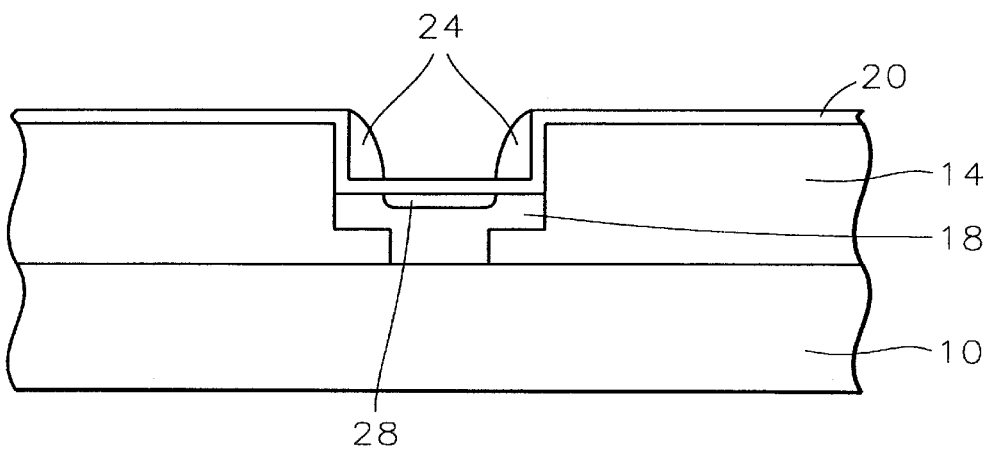

Now, a layer 22 of silicon nitride, nitrided oxide, or oxynitride is deposited over the liner oxide 20 to a thickness of between about 3000 and 6000 Angstroms, as shown in FIG. 5. The layer 22 is anisotropically etched back to leave spacers 24 on the inside sidewalls of the trench as shown in FIG. 6.

Now, a threshold voltage implant 28 is made through the gate oxide into the silicon 18. For example, for an NMOS device, $BF_2$ ions are implanted at between about 1E12 to 1E13 atoms/$cm^2$ at 40 to 50 KeV. For a PMOS device, phosphorus or arsenic ions are implanted at 1E12 to 1E13 atoms/$cm^2$ at between about 40 and 50 KeV.

Figure 7:
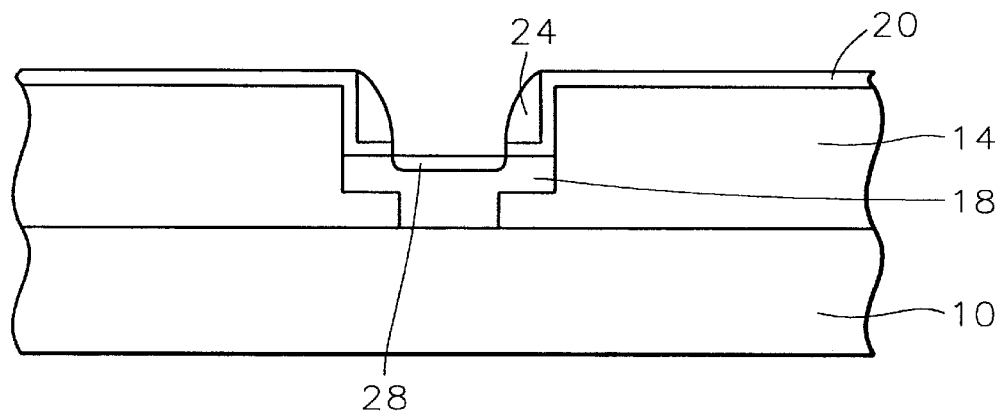

Referring now to FIG. 7, the liner oxide within the trench not covered by the spacers 24 is removed, preferably using a wet etch to minimize silicon damage.

Figure 8:
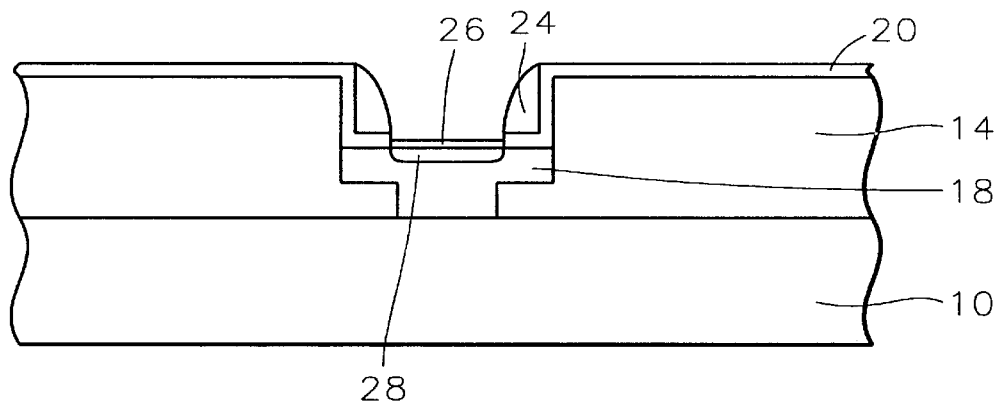

Gate oxide 26 is regrown on the exposed silicon 18 within the trench to a thickness of between about 35 and 50 Angstroms, as shown in FIG. 8.

Figure 9:
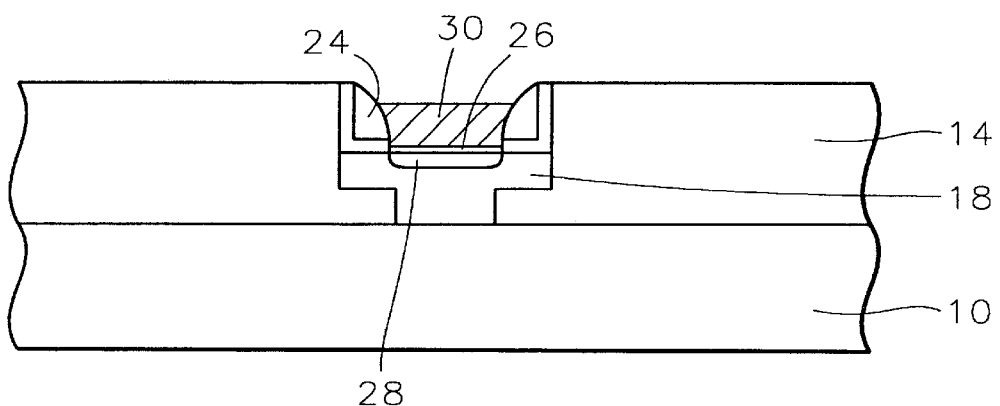

Now, a layer of polysilicon is deposited over the substrate and filling the trench. The polysilicon layer is doped, as is conventional, then etched back to leave a polysilicon gate 30 recessed within the trench, as seen in FIG. 9.

Figure 10:
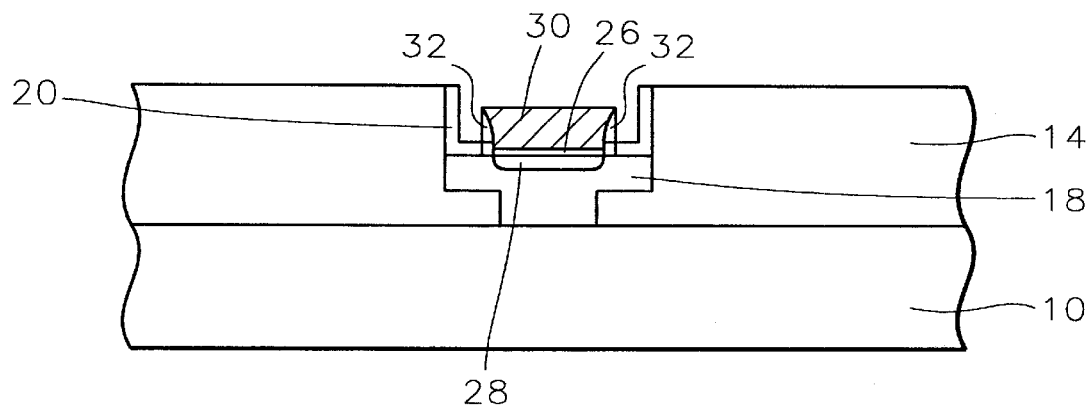

Referring now to FIG. 10, a self-aligned nitride etch is performed with high selectivity to silicon nitride over oxide, polysilicon, and silicon. For example, any of the following chemistries may be used: $Co/C_4F_8/Ar/O_2$, $SF_6/O_2/Ar,He$, $NF_3/O_2/Ar,He$. That is, the silicon nitride spacers 24 are removed where they are not covered by the polysilicon gate 30, leaving very thin nitride spacers 32. An intentionally prolonged nitride overetch will etch into the underlying oxide 20 and 14, leaving behind about 100 to 200 Angstroms of oxide 20.

Figure 11:
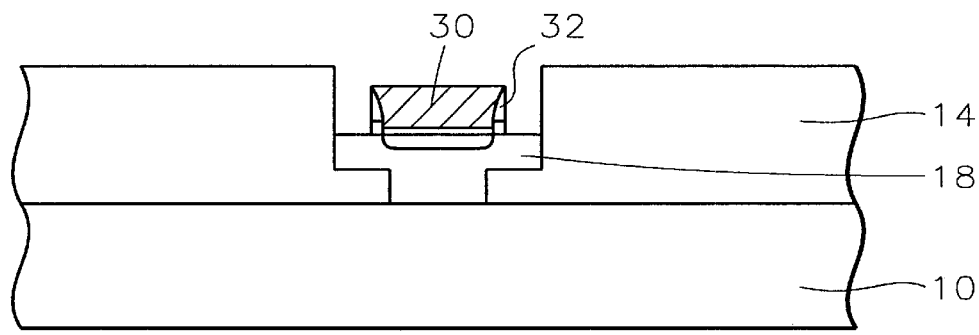

A self-aligned oxide strip removes the liner oxide 20 where it is not covered by the nitride spacers 32, as shown in FIG. 11. For example, the liner oxide may be removed by diluted hydrofluoric acid (DHF) (100:1) at about 24° C. for 60 to 80 seconds. The silicon layer 18 is now exposed adjacent to the gate 30.

Figure 12:
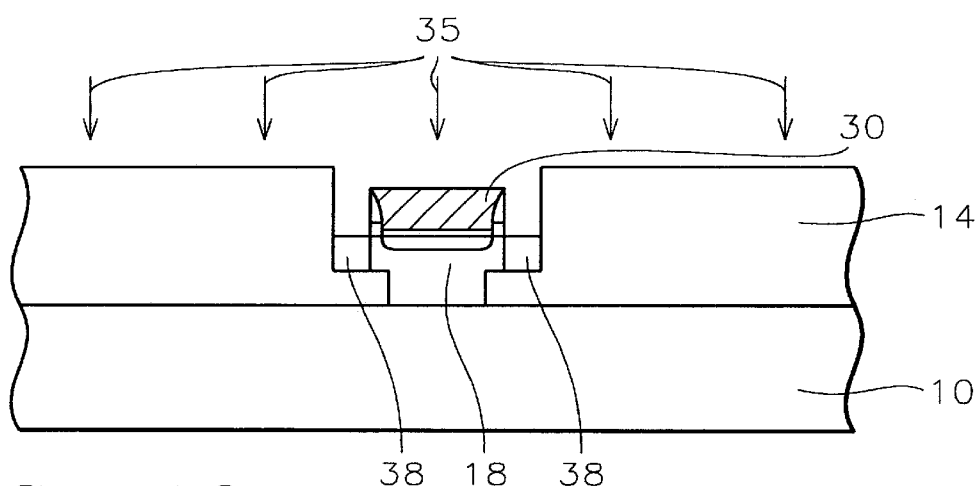

Referring now to FIG. 12, a self-aligned source/drain implant 35 forms source and drain regions 38 within the silicon 18 adjacent to the gate electrode 30. The source/drain regions or pockets 38 have a junction depth determined by the thickness of the SEG layer 18 and are not determined by thermal drive-in.

For example, a large angle tilt implant is made with four-way rotation. For a N+ implant, arsenic ions are implanted at about 1E15 atoms/$cm^2$ at 50 to 60 KeV. For a P+ implant, phosphorus ions are implanted at about 1E15 atoms/$cm^2$ at 30 to 40 KeV. A $N_2$ anneal at 800–900° C. for 15 to 20 seconds is preferred to get lateral diffusion of dopants to form NLDD or PLDD regions.

Figure 13:
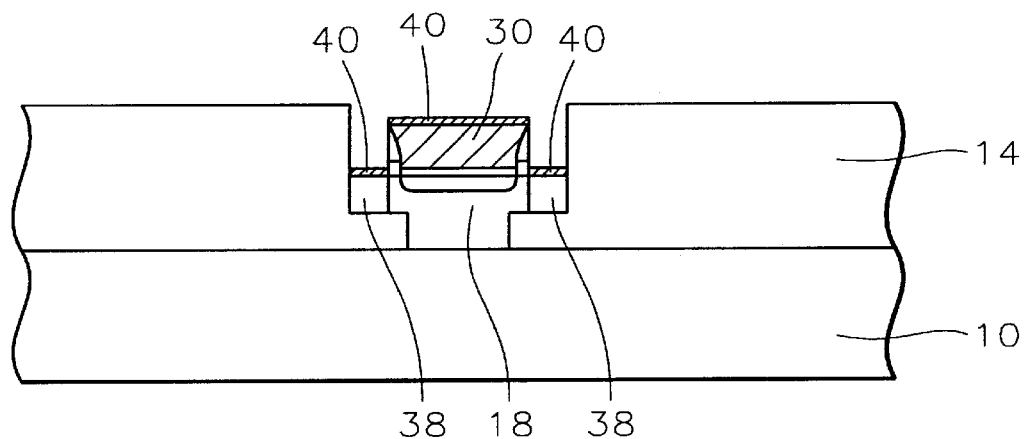

The gate and source/drain pockets are silicided 40, as shown in FIG. 13. For example, the wafer surface is cleaned, such as by DHF and $NH_4OH/H_2O_2/H_2O$. Titanium is deposited to a thickness of between about 200 to 300 Angstroms. Silicon is implanted through the titanium layer at a dosage of about 1E13 atoms/$cm^2$ at 40 to 50 KeV. A rapid thermal process (RTP) forms the salicide layer 40 on the silicon and polysilicon surfaces, as shown.

Figure 14:
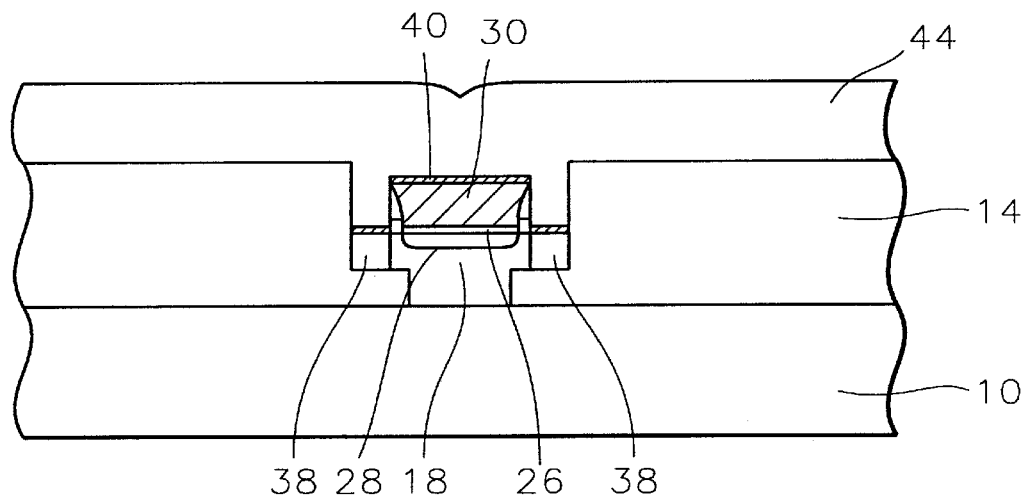

FIG. 14 shows dielectric layer 44 isolating the elevated transistor 30 of the invention. Dielectric layer may be, for example, tetraethoxysilane (TEOS) oxide, phosphosilicate glass (PSG), borosilicate glass (BSG), HSQ, or high density plasma (HDP) fluorosilicate glass (FSG).

Processing continues as is conventional in the art to form electrical contacts to the source/drain and gate areas outside of the cross-section shown in the figures, as is understood in the art.

The new self-aligned elevated transistor of the invention will now be described with reference to FIG. 14. An oxide layer 14 overlies a semiconductor substrate 10. A silicon layer 18 fills a lower portion of a trench through the oxide layer and partially fills an upper portion of the trench wherein the lower portion of the trench contacts the semiconductor substrate and has a width smaller than a width of the upper portion of the trench. A polysilicon gate electrode 30 overlies a center portion of the silicon layer having a gate oxide layer 26 therebetween. Source/drain pockets 38 lie within the silicon layer at edge portions of the silicon layer not covered by the polysilicon gate electrode 30. A dielectric layer 44 overlies the oxide layer and the gate electrode and source/drain pockets within the trench to complete elevated transistor in an integrated circuit device.

The process of the present invention provides an effective and very manufacturable method for fabricating an elevated transistor. This is a simpler process than SIMOX (separation by implantation of oxygen) or SOI (silicon on insulator) processes. For example, the inventive process requires no oxygen implantation and no annealing treatment, which reduces the thermal budget. The process of the invention results in a new structure that is midway between a partially depleted SOI and a fully depleted SOI. Partially depleted SOI's pose long-term unstable I-V characteristics while fully depleted SOI's do not allow SEG implementation. This invention provides the advantages of a fully depleted SOI while allowing SEG implementation and also allowing back gate biasing. The process of the invention allows absolute control over some device parameters, most significantly the junction depth of the source/drain regions which is controlled by the thickness of the selective epitaxial growth.

The process of the invention has a number of advantages over current STI structures. A lower leakage current is achieved by the invention because leakage currents are confined to one direction; that is, laterally from the source/drain structures into the channel area. Conventional buried source/drain regions have leakage currents in all directions into the substrate. Since the transistor is formed in a self-aligned process within a trench and having isolation therearound, there is an increase in packing density over STI processes. No excessive etching of the substrate is required to form a trench. No hump effects or CMP-induced dishing occur.

Other advantages include the ability to control the orientation of the SEG growth because of the presence of the oxide 14 "frame." The process is totally self-aligned, thereby eliminating masking steps and allowing smaller feature sizes. A more planar overall topology results as well.

While the invention has been particularly shown and described with reference to the preferred embodiments thereof, it will be understood by those skilled in the art that various changes in form and details may be made without departing from the spirit and scope of the invention.

What is claimed is:

1. An elevated transistor in an integrated circuit comprising:
    an oxide layer overlying a semiconductor substrate;
    a silicon layer filling a lower portion of a trench within said oxide layer and partially filling an upper portion of said trench, wherein said lower portion of said trench contacts said semiconductor substrate and has a width smaller than a width of said upper portion of said trench;
    a polysilicon gate electrode overlying a center portion of said silicon layer having a gate oxide layer therebetween, wherein the polysilicon gate electrode is formed within the trench;
    source/drain pockets within said silicon layer at edge portions of said silicon layer not covered by said polysilicon gate electrode; and
    a dielectric layer overlying said oxide layer, said polysilicon gate electrode, and said source/drain pockets to complete said elevated transistor in said integrated circuit device.

2. The elevated transistor according to claim 1 wherein said trench has a width as small as 1.0 to 1.25 microns.

3. The elevated transistor according to claim 1 wherein said oxide layer comprises thermal oxide and has a thickness of between about 4000 and 6000 Angstroms.

4. The elevated transistor according to claim 1 wherein said silicon layer has a controlled thickness corresponding to a desired junction depth of said source/drain pockets.

5. The elevated transistor according to claim 4 wherein said thickness is between about 1000 and 2000 Angstroms.

6. The elevated transistor according to claim 1 further comprising a liner oxide layer within said trench underlying nitride spacers.

7. The elevated transistor according to claim 1 further comprising a layer of silicide overlying said polysilicon gate electrode and said source/drain pockets.

8. The elevated transistor according to claim 6 wherein said liner oxide layer has a thickness of between about 500 and 1000 Angstroms.

9. An elevated transistor in an integrated circuit comprising:
    an oxide layer overlying a semiconductor substrate;
    a silicon layer filling a lower portion of a trench within said oxide layer and partially filling an upper portion of said trench, wherein said lower portion of said trench contacts said semiconductor substrate and has a width smaller than a width of said upper portion of said trench;
    a liner oxide layer overlying said silicon layer within said trench;
    a polysilicon gate electrode overlying a center portion of said silicon layer having a gate oxide layer therebetween, wherein the polysilicon gate electrode is formed within the trench;
    source/drain pockets within said silicon layer at edge portions of said silicon layer not covered by said polysilicon gate electrode; and
    a dielectric layer overlying said oxide layer, said polysilicon gate electrode, and said source/drain pockets to complete said elevated transistor in said integrated circuit device.

10. The elevated transistor according to claim 9 wherein said trench has a width as small as 1.0 to 1.25 microns.

11. The elevated transistor according to claim 9 wherein said oxide layer comprises thermal oxide and has a thickness of between about 4000 and 6000 Angstroms.

12. The elevated transistor according to claim 9 wherein said silicon layer has a controlled thickness corresponding to a desired junction depth of said source/drain pockets.

13. The elevated transistor according to claim 12 wherein said thickness is between about 1000 and 2000 Angstroms.

14. The elevated transistor according to claim 9 further comprising a silicide layer overlying said polysilicon gate electrode and said source/drain pockets.

15. The elevated transistor according to claim 9 wherein said liner oxide layer has a thickness of between about 500 and 1000 Angstroms.

16. An elevated transistor in an integrated circuit comprising:

an oxide layer overlying a semiconductor substrate;

a silicon layer filling a lower portion of a trench within said oxide layer and partially filling an upper portion of said trench, wherein said lower portion of said trench contacts said semiconductor substrate and has a width smaller than a width of said upper portion of said trench;

a liner oxide layer overlying said silicon layer within said trench;

a silicided polysilicon gate electrode overlying a center portion of said silicon layer having a gate oxide layer therebetween, wherein the silicided polysilicon gate electrode is formed within the trench;

silicided source/drain pockets within said silicon layer at edge portions of said silicon layer not covered by said silicided polysilicon gate electrode; and a dielectric layer overlying said oxide layer, said silicided polysilicon gate electrode, and said silicided source/drain pockets to complete said elevated transistor in said integrated circuit device.

17. The elevated transistor according to claim 16 wherein said trench has a width as small as 1.0 to 1.25 microns.

18. The elevated transistor according to claim 16 wherein said oxide layer comprises thermal oxide and has a thickness of between about 4000 and 6000 Angstroms.

19. The elevated transistor according to claim 16 wherein said silicon layer has a controlled thickness of between about 1000 and 2000 Angstroms, corresponding to a desired junction depth of said source/drain pockets.

20. The elevated transistor according to claim 16 wherein said liner oxide layer has a thickness of between about 500 and 1000 Angstroms.

* * * * *

UNITED STATES PATENT AND TRADEMARK OFFICE
CERTIFICATE OF CORRECTION

PATENT NO. : 6,483,148 B2 Page 1 of 1
APPLICATION NO. : 10/060818
DATED : November 19, 2002
INVENTOR(S) : Lap Chan and Cher Liang Cha It is certified that error appears in the above-identified patent and that said Letters Patent is hereby corrected as shown below:

On the Title page, in item (73), please add --National University Of Singapore, Singapore (SG)-- as the second assignee.

Signed and Sealed this

Fifth Day of June, 2007

JON W. DUDAS
*Director of the United States Patent and Trademark Office*